(12) United States Patent
Yan

(10) Patent No.: US 12,501,641 B2
(45) Date of Patent: Dec. 16, 2025

(54) SHIELDED GATE MOSFET DEVICE AND MANUFACTURING METHOD THEREOF

(71) Applicant: Shanghai Huahong Grace Semiconductor Manufacturing Corporation, Shanghai (CN)

(72) Inventor: Shufan Yan, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 473 days.

(21) Appl. No.: 18/079,957

(22) Filed: Dec. 13, 2022

(65) Prior Publication Data
US 2023/0215932 A1    Jul. 6, 2023

(30) Foreign Application Priority Data

Jan. 6, 2022  (CN) .......................... 202210008426.6

(51) Int. Cl.
| | |
|---|---|
| *H10D 30/01* | (2025.01) |
| *H01L 21/265* | (2006.01) |
| *H10D 30/66* | (2025.01) |
| *H10D 62/17* | (2025.01) |
| *H10D 64/00* | (2025.01) |
| *H10D 64/27* | (2025.01) |

(52) U.S. Cl.
CPC ... *H10D 30/0297* (2025.01); *H01L 21/26513* (2013.01); *H10D 30/668* (2025.01); *H10D 62/393* (2025.01); *H10D 64/117* (2025.01); *H10D 64/516* (2025.01)

(58) Field of Classification Search
CPC ............. H10D 30/0297; H10D 30/668; H10D 64/027; H10D 64/117; H10D 64/516
See application file for complete search history.

(56) References Cited

U.S. PATENT DOCUMENTS

| | | | | |
|---|---|---|---|---|
| 8,558,308 | B1* | 10/2013 | Blank ................. | H10D 12/481 438/270 |
| 9,530,882 | B1* | 12/2016 | Hsieh .................. | H10D 30/665 |
| 2007/0138547 | A1* | 6/2007 | Nakamura ........... | H10D 64/117 257/331 |
| 2014/0015045 | A1* | 1/2014 | Su ...................... | H10D 84/0156 257/334 |
| 2019/0097041 | A1* | 3/2019 | Ohtani ................ | H10D 64/518 |

(Continued)

FOREIGN PATENT DOCUMENTS

| | | |
|---|---|---|
| CN | 104617045 A | 5/2015 |
| CN | 105355560 A | 2/2016 |
| CN | 105895516 A | 8/2016 |

(Continued)

*Primary Examiner* — Joseph C. Nicely
(74) *Attorney, Agent, or Firm* — Harris Beach Murtha Cullina PLLC

(57) ABSTRACT

A shielded gate MOSFET device and a manufacturing method thereof is provided. In the method, the shielded gate thick dielectric layers are formed with the thick oxide layer process at the bottoms in the trenches, poly is deposited in each trench and is back etched to leave gate poly on the side wall of each trench, whereas the portion, right in the center of each trench, of the thin poly layer is removed to be filled with the contact hole dielectric layer, which achieves the effect of streamlining the process flow.

2 Claims, 6 Drawing Sheets

(56) References Cited

U.S. PATENT DOCUMENTS

2019/0123158 A1* 4/2019 Ohtani ................ H10D 64/256
2021/0151596 A1* 5/2021 Chuang ............... H10D 30/664

FOREIGN PATENT DOCUMENTS

| CN | 106876279 A | * | 6/2017 | ......... H10D 30/0297 |
| CN | 107799601 A | | 3/2018 | |
| CN | 109065542 A | * | 12/2018 | ........... H10D 84/016 |
| CN | 111883515 A | | 11/2020 | |
| CN | 113299754 A | * | 8/2021 | ........... H10D 30/611 |

* cited by examiner

SHIELDED GATE MOSFET DEVICE AND MANUFACTURING METHOD THEREOF

CROSS-REFERENCES TO RELATED APPLICATIONS

This application claims priority to Chinese patent application No. CN 202210008426.6, filed at CNIPA on Jan. 6, 2022, and entitled "SHIELDED GATE MOSFET DEVICE AND MANUFACTURING METHOD THEREOF," the disclosure of which is incorporated herein by reference in its entirety.

TECHNICAL FIELD

This application relates to the field of semiconductor devices and manufacturing therefor, in particular to a shielded gate MOSFET device and a manufacturing method thereof.

BACKGROUND

As the requirement for consumer electronic products grows, the requirement for metal-oxide-semiconductor field-effect transistors (MOSFET) is increasing, for example, the requirement for application aspects of a drive piece, electronic communication equipment, a power device and the like. A drain current of a MOSFET device is controlled through gate voltage; and the MOSFET device has the characteristics of small drive power, small drive current, high input impedance, rapidness in switching speed, good thermal stability and the like and is widely applied.

In the related art, the design and the manufacturing method for the MOSFET device has been improving continuously. As the severity of market competition is intensified, the requirement for cost control becomes higher and higher. Therefore, how to lower the manufacturing cost without weakening the performance of the device is also an important research direction at present.

In regard to control over the manufacturing cost, a major direction is related to the number of times of photoetching, and poly deposition is achieved by using a photolithographic reticle; and in the related art, if poly is deposited for multiple times, the number of times of using the photolithographic reticle requires is to be increased.

SUMMARY

This application provides a shielded gate MOSFET device and a manufacturing method thereof and aims at solving the cost problem caused by too many times of photoetching in the related art.

In one aspect, the embodiment of this application provides the manufacturing method of the shielded gate MOSFET device, comprising the following steps of:
  providing a substrate 1, and forming first trenches S1 in the substrate 1 with etching;
  filling the bottoms of the first trenches S1 with shielded gate thick dielectric layers 2 respectively;
  forming gate dielectric layers 3 on the shielded gate thick dielectric layers 2 and on the inner walls of the first trenches S1 respectively;
  forming gate polysilicon 4 at the positions close to the side walls of the gate dielectric layers 3 with deposition;
  forming well implant 5 in the two sides of the gate dielectric layers 3 with the ion implantation technology, and forming sources 6 on the well implant 5;
  forming a contact hole dielectric layer 7 on the sources 6 and the shielded gate thick dielectric layers 2 with deposition;
  etching the contact hole dielectric layer 7 so as to form contact holes 71 in the shielded gate thick dielectric layers 2, the gate polysilicon 4 and the sources 6; and
  forming back side metal 8 on the back surface of the substrate 1, and filling the contact holes 71 with front side metal 9.

In another aspect, provided is a shielded gate MOSFET device, at least comprising:
  a substrate 1 provided with first trenches S1; shielded gate thick dielectric layers 2 filling the bottoms of the first trenches S1; gate polysilicon 4 formed on the shielded gate thick dielectric layers 2; gate dielectric layers 3, clinging to the inner walls of the first trenches S1, formed on the side walls of the gate polysilicon 4;
  gate polysilicon 4 formed on the shielded gate thick dielectric layers 2, wherein the gate dielectric layers 3 are formed on the side walls of the gate polysilicon 4; well implant 5 formed in the two sides of the gate dielectric layers 3, wherein sources 6 are disposed on the well implant 5; a contact hole dielectric layer 7 covering the tops of the shielded gate thick dielectric layers 2 and the tops of the sources 6;
  back side metal 8 formed on the back surface of the substrate 1; and front side metal 9 filling the contact holes 71 formed in the well implant 5, the gate polysilicon 4 and the shielded gate thick dielectric layers 2.

Accordingly, the present invention provides the manufacturing method of the shielded gate MOSFET device, comprising the following steps of: providing the substrate, and forming the first trenches in the substrate with etching; filling the bottoms of the first trenches with the shielded gate thick dielectric layers respectively; forming the gate dielectric layers on the shielded gate thick dielectric layers and on the inner walls of the first trenches respectively; forming the gate poly at the positions close to the side walls of the gate dielectric layers with deposition; forming the well implant on the two sides of the gate dielectric layers with the ion implantation technology, and forming the sources on the well implant; forming the contact hole dielectric layer on the sources and the shielded gate thick dielectric layers with deposition; etching the contact hole dielectric layer so as to form the contact holes in the shielded gate thick dielectric layers, the gate poly and the sources; and forming the back side metal on the back surface of the substrate, and filling the contact holes with the front side metal. In the embodiment of this application, the shielded gate thick dielectric layers are formed with the thick oxide layer process at the bottoms in the trenches; a thin layer of poly material is deposited in each trench and is back etched to leave the gate poly on the side wall of each trench; whereas the portion, right in the center of each trench, of the thin poly layer is removed to be filled with the contact hole dielectric layer. Compared with the related art, in which the sources are deposited firstly, and then the gate poly is deposited, for the device, the poly in a traditional shielded gate is replaced with the deep contact holes, which achieves the effect of streamlining the process flow.

BRIEF DESCRIPTION OF THE DRAWINGS

In order to more clearly describe the technical solutions of the specific implementations of this application, the accompanying drawings required to describe the specific implementations are briefly described below. Accordingly, the accompanying drawings described below are some implementations of this application. Those of ordinary skill in the art may further obtain other accompanying drawings based on these accompanying drawings without inventive effort.

DETAILED DESCRIPTION

Figure 1:
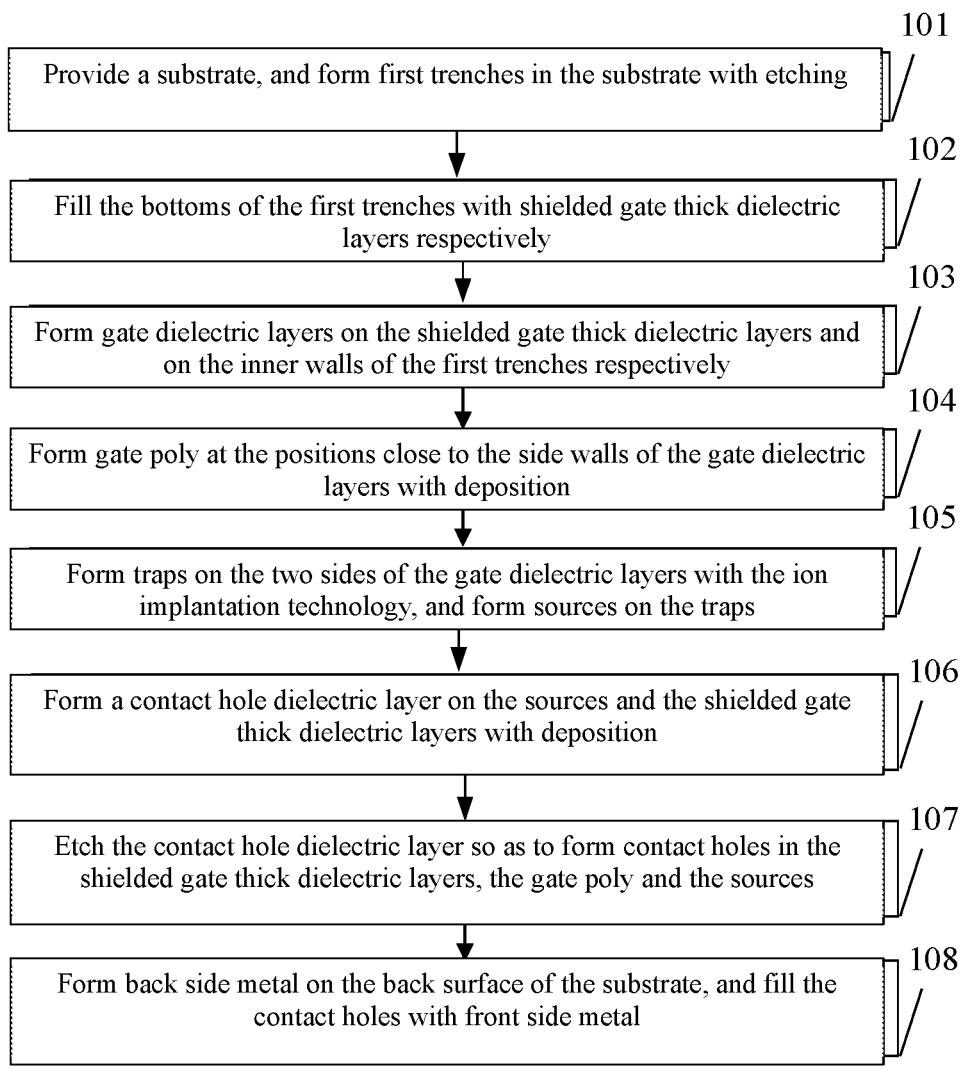
FIG. 1 is a flowchart of a manufacturing method for a shielded gate MOSFET device according to an embodiment of the present invention.

The technical solutions in this application are described clearly and completely in the following with reference to the accompanying drawings. Accordingly, the described embodiments are only part rather than all of the embodiments of this application. Based on the embodiments of this application, all the other embodiments obtained by that of ordinary skill in the art without inventive effort are within the scope of this application.

In description of this application, it should be noted that orientations or positional relationships indicated by terms, such as "center," "upper," "lower," "left," "right," "vertical," "horizontal," "inner," and "outer," are based on orientations or positional relationships shown in the drawings, are to facilitate the description of this application and simplify the description merely, do not indicate or imply that the referred apparatuses or elements must have specific orientations and are constructed and operated in the specific orientations and thus should not be construed to limit this application. Moreover, terms like "first," "second," and "third" are only used for description and should not be considered as a designation or designation of relative importance.

In description of this application, it should be noted that unless otherwise expressly specified and defined, the terms "mounted," "connected," and "coupled" should be understood broadly, for example, as fixed connection, detachable connection, or integral connection; mechanical connection or electrical connection; direct connection, indirect connection through an intermediary medium or communicating between interiors of two elements; or wireless connection or wired connection. The meanings of above terms in this application may be understood in specific cases to those of ordinary skill in the art.

Moreover, the technical features mentioned in different implementations of this application, which are described below, can be combined with each other as long as they do not conflict with each other.

Referring to FIG. 1, showing a flowchart of a manufacturing method for a shielded gate MOSFET device according to an illustrative embodiment of this application, the method comprises the following steps of:

step 101, providing a substrate, and forming first trenches in the substrate with etching;

step 102, filling the bottoms of the first trenches with shielded gate thick dielectric layers respectively;

step 103, forming gate dielectric layers on the shielded gate thick dielectric layers and on the inner walls of the first trenches respectively;

step 104, forming gate poly at the positions close to the side walls of the gate dielectric layers with deposition;

step 105, forming well implant in the two sides of the gate dielectric layers with the ion implantation technology, and forming sources on the well implant;

step 106, forming a contact hole dielectric layer on the sources and the shielded gate thick dielectric layers with deposition;

step 107, etching the contact hole dielectric layer so as to form contact holes in the shielded gate thick dielectric layers, the gate poly and the sources; and step 108, forming back side metal on the back surface of the substrate, and filling the contact holes with front side metal.

Specifically, referring to FIGS. 2-7, FIGS. 2-7 are structural diagrams of semiconductors in various process steps of manufacturing a shielded gate MOSFET device according to an embodiment of the present invention.

Figure 2:
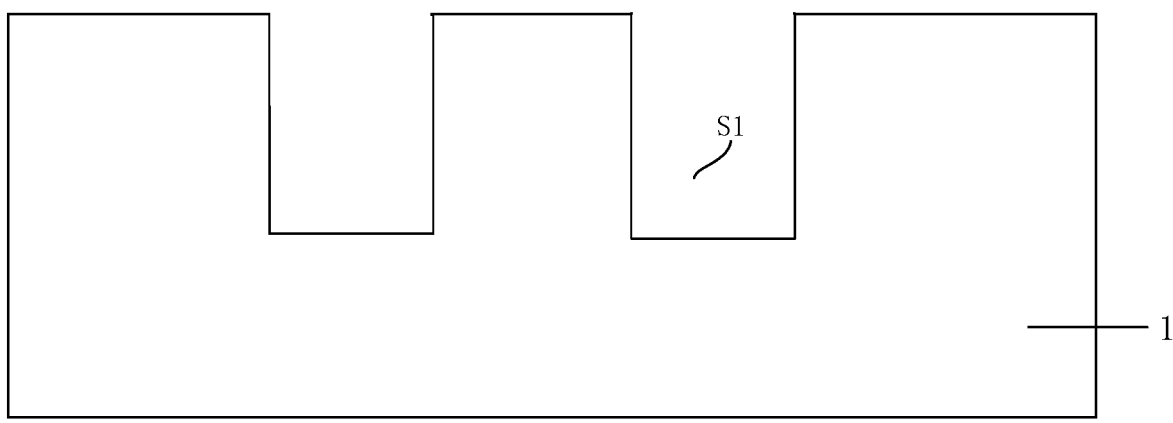
FIGS. 2-7 are structural diagrams of semiconductors in various process steps of manufacturing a shielded gate MOSFET device according to an embodiment of the present invention.

Firstly, as shown in FIG. 2, the substrate 1 is provided, and the first trenches S1 are formed in the substrate 1 with etching; and specifically, the substrate 1 may be made of one of monocrystalline silicon, poly and amorphous silicon, may further be made of gallium arsenide, a silicon-gallium compound and the like and may further be of a silicon-on-insulator layer structure, an epitaxial layer-on-silicon structure or the like, which will not be illustrated in full details here.

Figure 3:
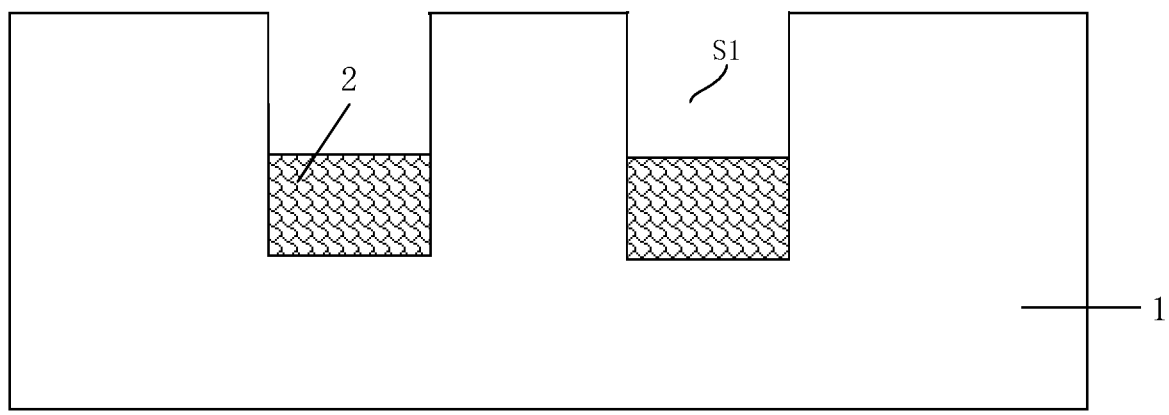

Then, as shown in FIG. 3, the bottoms of the first trenches S1 are filled with the shielded gate thick dielectric layers 2, and a depth of each shielded gate thick dielectric layer 2 is smaller than that of the corresponding first trench S1.

Figure 4:
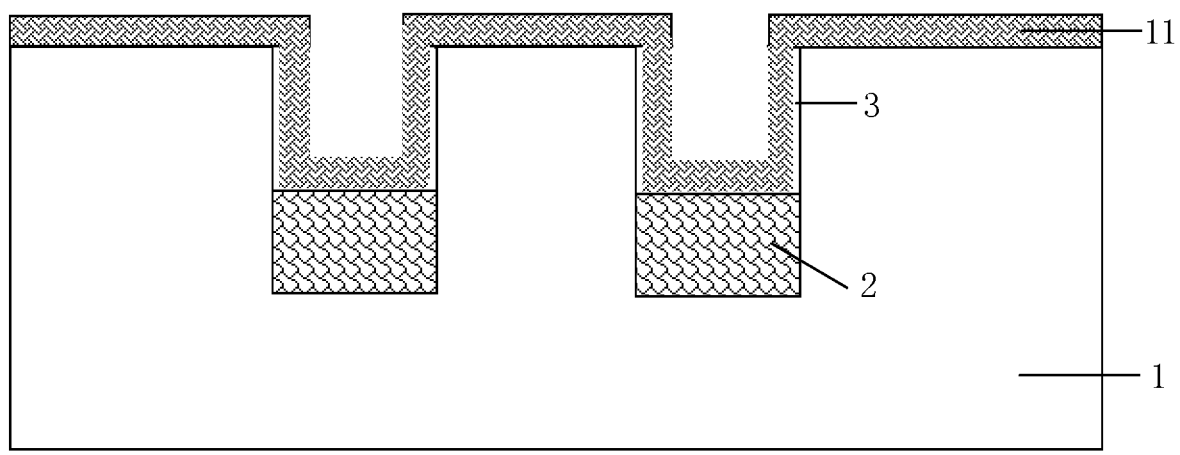

As shown in FIG. 4, the gate dielectric layers 3 are formed on the shielded gate thick dielectric layers 2 and on the inner walls of the first trenches S1 respectively. Further, as shown in FIG. 5, the gate polysilicon 4 is formed at the positions close to the side walls of the gate dielectric layers 3 with deposition, wherein formation of the gate polysilicon 4 comprises the following contents of: depositing poly 11 in the first trenches S1 and on the top of the substrate 1, wherein thin poly layers are formed at the flat part on the shielded gate thick dielectric layers 2 and on the top of the substrate 1, and thick poly layers are formed at the positions close to the side walls of the gate dielectric layers 3; and removing the thin poly layers, and reserving the gate polysilicon 4 at the positions close to the side walls of the gate dielectric layers 3, wherein the gate polysilicon 4 is located on the shielded gate thick dielectric layers 2;

wherein a thickness of each shielded gate thick dielectric layer 2 and a thickness of each gate dielectric layer 3 are not limited.

Figure 5:
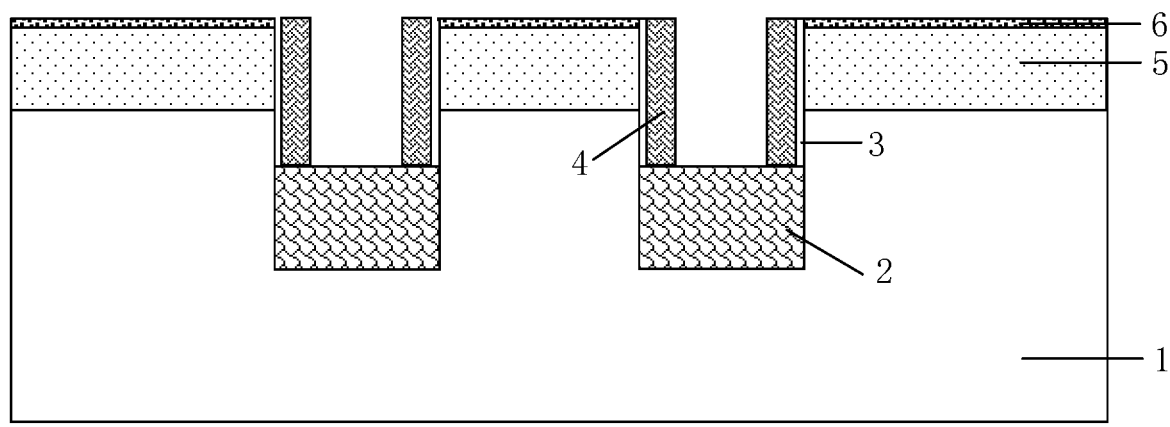

With continued reference to FIG. 5, the well implant 5 is formed in the two sides of the gate dielectric layers 3 with the ion implantation technology, and the sources 6 are formed on the well implant 5.

Figure 6:
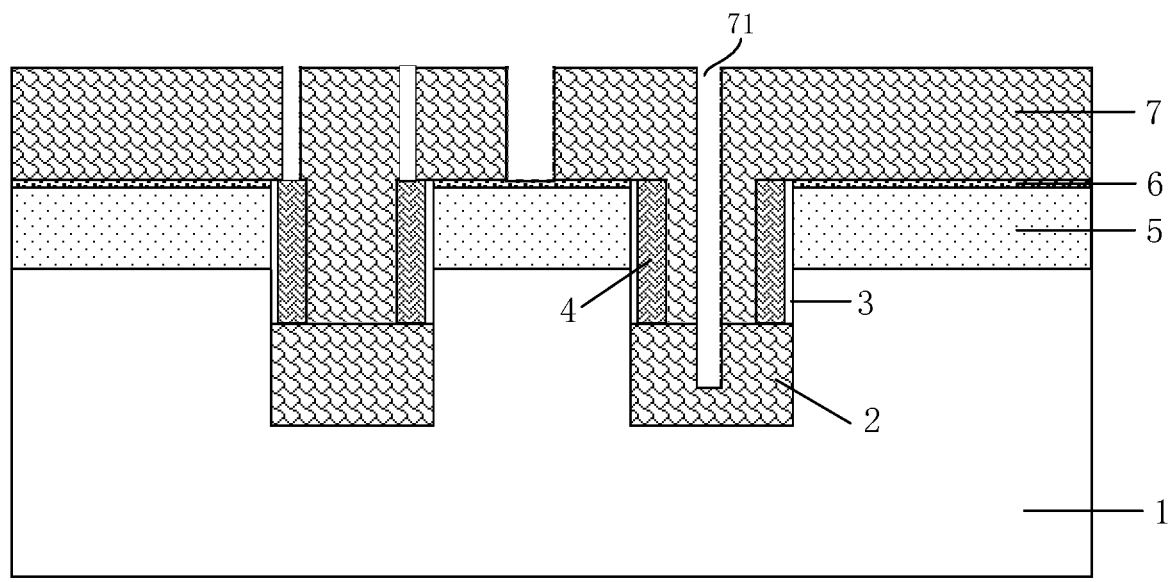

Referring to FIG. 6, the contact hole dielectric layer 7 is deposited on the sources 6 and the shielded gate thick dielectric layers 2; and after deposition of the contact hole dielectric layer 7, the contact hole dielectric layer 7 is etched so as to form contact holes 71 in the shielded gate thick dielectric layers 2, the gate polysilicon 4 and the sources 6.

Figure 7:
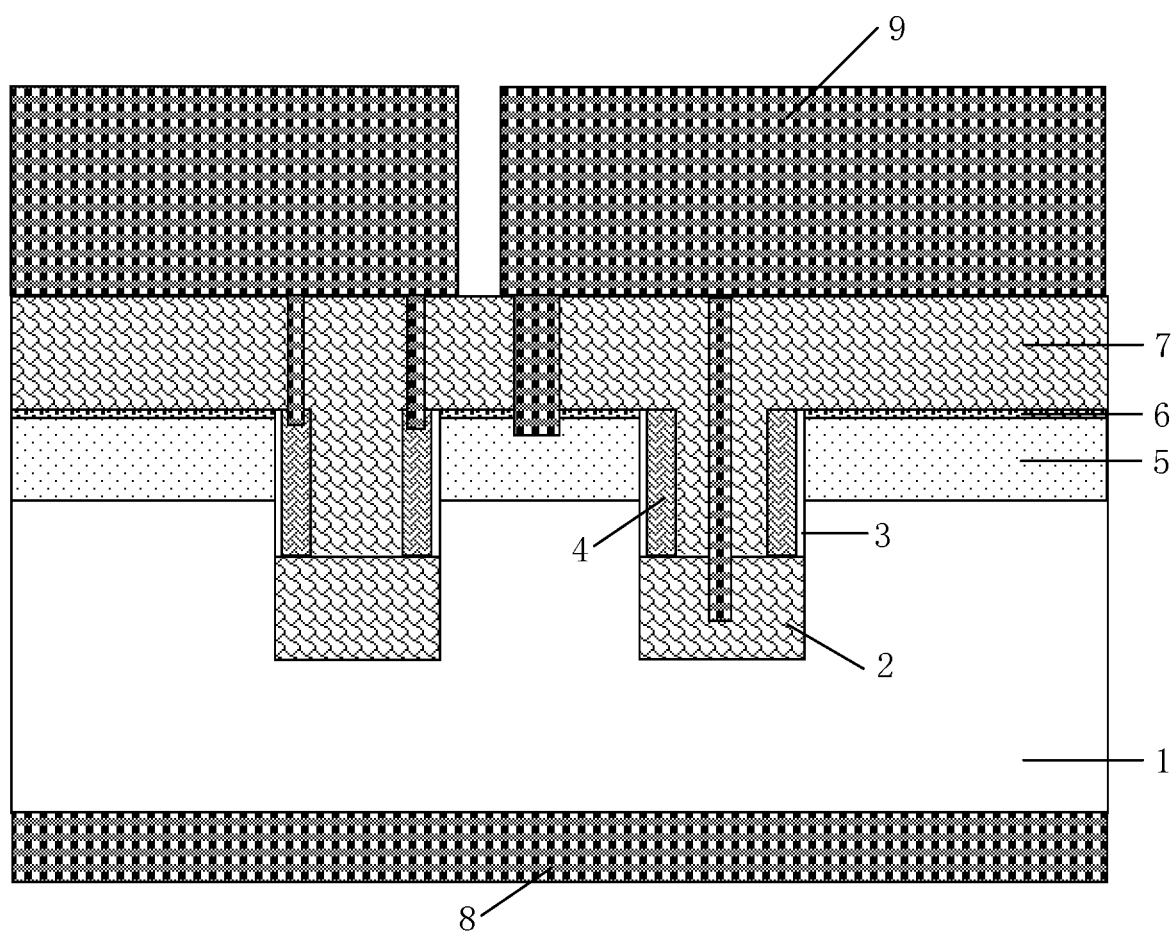

Finally, as shown in FIG. 7, the back side metal 8 is formed on the back surface of the substrate 1, and the contact holes 71 are filled with the front side metal 9.

Accordingly, the present invention provides the manufacturing method for the shielded gate MOSFET device, comprising the following steps of: providing the substrate, and forming the first trenches in the substrate with etching; filling the bottoms of the first trenches with the shielded gate thick dielectric layers respectively; forming the gate dielectric layers on the shielded gate thick dielectric layers and on the inner walls of the first trenches respectively; forming the gate poly at the positions close to the side walls of the gate dielectric layers with deposition; forming the well implant on the two sides of the gate dielectric layers with the ion implantation technology, and forming the sources on the well implant; forming the contact hole dielectric layer on the sources and the shielded gate thick dielectric layers with deposition; etching the contact hole dielectric layer so as to form the contact holes in the shielded gate thick dielectric layers, the gate poly and the sources; and forming the back side metal on the back surface of the substrate, and filling the contact holes with the front side metal. In the embodiment of this application, the shielded gate thick dielectric layers are formed with the thick oxide layer process at the bottoms in the trenches; poly is deposited in each trench and is back etched to leave the gate poly on the side wall of each trench; whereas the portion, right in the center of each trench, of the thin poly layer is removed to be filled with the contact hole dielectric layer. Compared with the related art, in which the gate poly is deposited firstly, and then shielded gate poly is deposited, for the device, the poly in a traditional shielded gate is replaced with the deep contact holes, which achieves the effect of streamlining the process flow.

The above-described embodiments are merely to clearly describe the examples, but not being as limiting to the implementations. To those of ordinary skill in the art, various other modifications or variations can further be made on the basis of the above description. All embodiments need not be, and cannot be, exhaustive herein. Obvious modifications or variations extended therefrom are still in the protection scope of this application.

What is claimed is:

1. A method of manufacturing a shielded gate MOSFET device, the method comprising the steps of:
   providing a substrate, and forming first trenches in the substrate with etching;
   filling the bottoms of the first trenches with shielded gate dielectric layers respectively;
   forming gate dielectric layers on the shielded gate dielectric layers and on the inner walls of the first trenches respectively;
   forming gate polysilicon at positions close to the side walls of the gate dielectric layers with deposition;
   forming well implant on two sides of the gate dielectric layers with the ion implantation technology, and forming sources on the well implant;
   forming a contact hole dielectric layer on the sources and the shielded gate dielectric layers with deposition;
   etching the contact hole dielectric layer so as to form contact holes in the shielded gate dielectric layers, the gate polysilicon and the sources; and
   forming back side metal on the back surface of the substrate, and filling the contact holes with front side metal.

2. The method according to claim 1, wherein the step of forming gate polysilicon at the positions close to the side walls of the gate dielectric layers with deposition comprises the steps of:
   depositing poly in the first trenches and on a top of the substrate, wherein poly layers are formed at a flat part on the shielded gate dielectric layers and on the top of the substrate, and additional poly layers are formed at the positions close to the side walls of the gate dielectric layers; and
   removing the poly layers, and forming the gate polysilicon at the positions close to the side walls of the gate dielectric layers with deposition.

* * * * *